METHOD OF ALLOYING TWO METALS

Filed April 24, 1970

INVENTOR.
Francis J. Papiano
BY Edward J. Norton
ATTORNEY

United States Patent Office 3,690,943
Patented Sept. 12, 1972

3,690,943

METHOD OF ALLOYING TWO METALS

Francis John Papiano, Cranbury, N.J., assignor to RCA Corporation

Filed Apr. 24, 1970, Ser. No. 31,600
Int. Cl. B44d *1/18*
U.S. Cl. 117—212 15 Claims

ABSTRACT OF THE DISCLOSURE

Two metals are alloyed by a method wherein the metals are coated on a surface which is passed through a standing wave of a heat transfer fluid to melt only the coating. Upon cooling, the two metals form a solid alloy on the surface.

BACKGROUND OF THE INVENTION

Figure 1C:
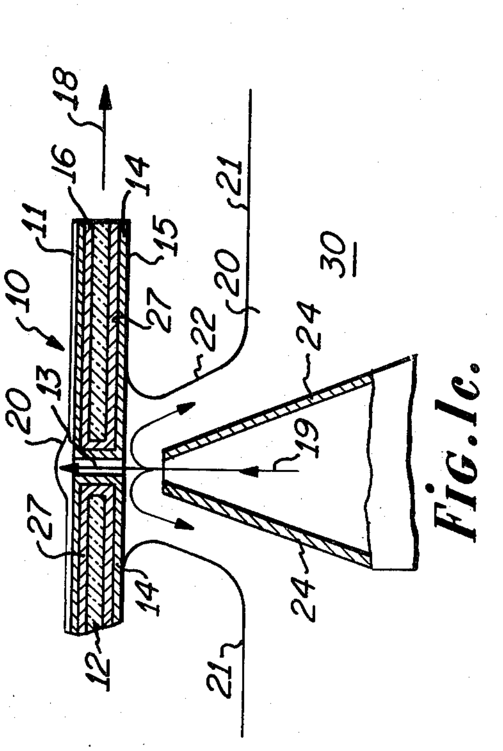

The present invention relates to processes for alloying two or more metals.

In the manufacture of printed circuit boards, printed circuitry is created by cladding a dielectric board with an electrical conductor such as copper on one or both sides of the boards which may have component lead holes formed therein. The copper cladding is then coated with a lead-tin deposit in accordance with a predetermined pattern which will form the printed circuit pattern of the finished board. The lead-tin serves as an etch resist and as a protective coating for the copper, and, being a form of common solder, facilitates the soldering of components to the board at a subsequent operation. After the lead-tin coating is applied to the copper in the desired configuration, the remaining copper is etched away, leaving a pattern of lead-tin coated copper formed by the lead-tin deposit.

However, in a process as described above, certain undesirable qualities of the etched printed circuit board remain. Foremost is the fact that the etching process undercuts the lead-tin coating, leaving stringers of lead-tin along the undercut edges. These stringers are possible sources of contamination and short circuit in a completed, assembled printed circuit board. The deposition process, usually electroplating, deposits a mixture of lead-tin which may permit undesirable oxidation to take place and, in addition, has a dull, esthetically poor appearance. Further, the etched portion of the cladding, i.e. the portion of the cladding exposed by the etching process at the edges of the conductors forming the printed circuit pattern, being without the lead-tin or other protective coating, oxidizes, presenting a subsequent storage problem. This oxidation precludes proper soldering of components to the printed circuit boards.

To overcome the difficulties enumerated, various processes have been developed including hand dipping the printed circuit boards with the deposited coating into a heat transfer fluid such as a hot oil bath, which process is relatively uncontrolled with respect to the final thickness of the lead-tin coating. Due to uneven exposure to the oil head transfer fluid and uneven dipping angles and rates, the melted solder forms undesirable nodules of the alloy in some locations on a printed circuit board while leaving submarginal thicknesses of alloy in other locations, all of which variations are neither uniform per board or consistent between boards, and which may require subsequent operations to correct.

Other known alloying processes, which are equally unsuccessful with respect to controlling the thickness of the lead-tin alloy, include blowing a heat transfer fluid such as oil under pressure at the printed circuit boards, spinning the boards while exposing them to an oil heat transfer fluid, spraying an oil heat transfer fluid at the boards, and most currently, melting the leadt-in coating by use of infrared techniques. In all these processes it has been found that minimum lead-tin alloy thicknesses could not be maintained nor controlled. If a heavier coating of lead-tin were deposited to provide the desired minimum alloy thickness which may be required for subsequent soldering operations, then it was found that the holes for the component leads would fill with solder. In none of these processes are uniform thicknesses of the alloy maintained.

In addition these other known alloy processes are not readily adaptable for continuous processing. Even when these other processes are exposed to uniform flow rates of the heat transfer fluid, when applicable and uniform processing rates of the printed circuit boards, the undesirable parameters still are manifested in the finished product. Most of these other processes are applicable to batch processing and do not readily lend themselves to continuous processes.

Accordingly, it is an object of the present invention to provide an improved method of alloying two or more metals on a surface.

It is another object to provide a method of alloying two or more metals on a surface having a controlled, uniform alloy thickness.

It is still another object to provide a process for alloying a lead-tin coating on the printed circuitry of a printed circuit board which will be substantially free of the imperfections noted above.

SUMMARY OF THE INVENTION

These and other objects are attained by the present invention in which two or more metals to be alloyed are deposited on a surface. The method of the present invention includes depositing the metals to be alloyed in contiguous relation with each other on a surface. This surface is then passed through a stationary wave of a heat transfer fluid which is at a temperature sufficiently high to melt the deposited metals. The heat transfer fluid is in thermal contact with the metals to be alloyed for a time sufficient to liquify the metals so that upon cooling the liquified metals form a solid alloy.

By alloying the metals in this manner, the alloy uniformly coats all of the exposed areas of the base surface on which it is deposited, resulting in a controlled, uniform alloy thickness.

Figure 1A:
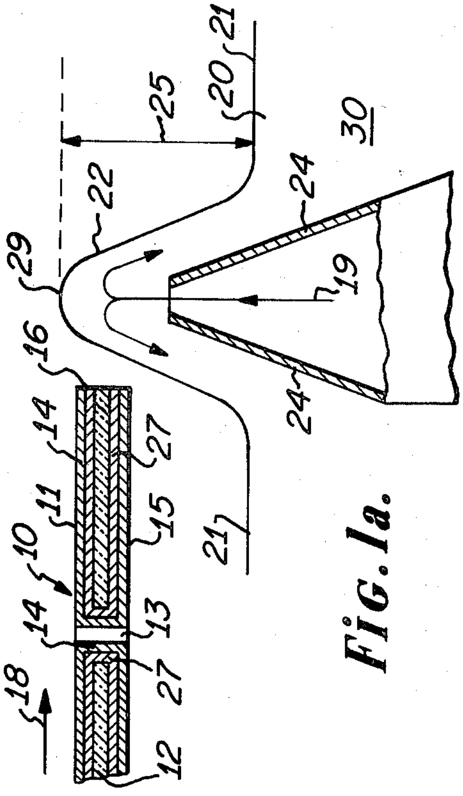
Figure 1B:
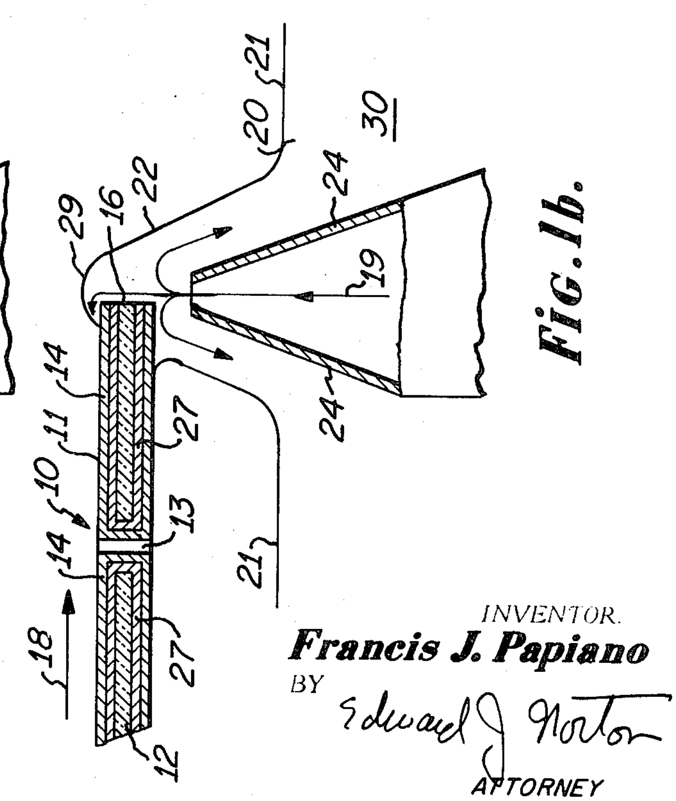

In the drawings:

FIGS. 1*a*–1*c* illustrate alloying a coating on a board having a through hole in accordance with the present invention.

Figure 2:
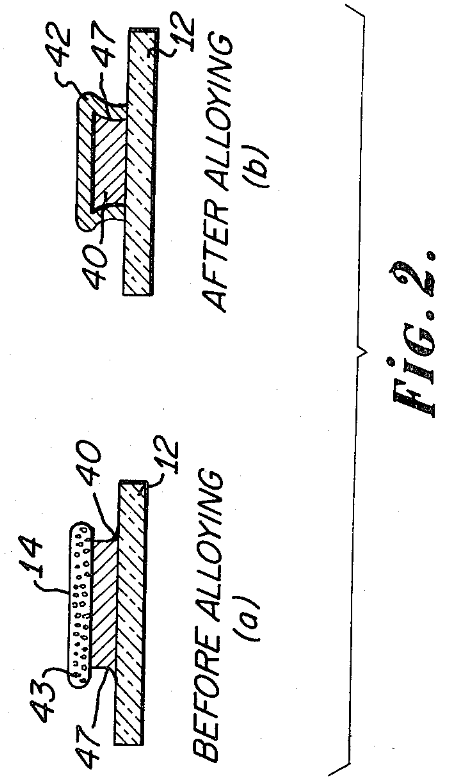

FIG. 2 illustrates a sectional view of a coating prior and subsequent to alloying in accordance with the process of the present invention.

DETAILED DESCRIPTION

In the process of the present invention, a continuous wave of heat transfer fluid is caused to be gently wiped against the surface to be alloyed. The continuous flow of the wave provides uniform heat distribution which results in maximum efficiency of heat transfer. This wave of heat transfer fluid provides continuous replenishing of the fluid as it flows against the surface to be alloyed providing agitation and assuring a substantially constant temperature of the heat transfer fluid. This constant temperature is provided even with rapid transfer of heat from the fluid to the surface to be alloyed. This process provides uniform melting, and thus, alloying of the coating. The gentle wiping action ensures that no excessive forces are exerted against the molten coating which may otherwise cause the coating to be unevenly distributed or removed from the surface. Further, a wave of heat transfer fluid with the surface to be alloyed passed therethrough provides a process readily adaptable to automatic processing techniques in that the surfaces to be alloyed may be continuously conveyed through the wave. The continuous relative motion between the fluid and the coated surface also tends to wipe away loosely adherent particles, such as loosely adhered metallic stringers or the like.

An example of a method of alloying at least two metals deposited on a surface is illustrated by FIG. 1, in which there is shown a planar printed circuit board 10 having a dielectric substrate 12, a copper cladding 27, and a coating 14 of at least two metals such as lead-tin deposited on the surfaces of the cladding according to a predetermined circuit pattern.

The thickness of the coating 14 may be of any suitable dimension prior to alloying but is preferably about 0.0005 to 0.0007 inch thick in order to achieve a preferred minimum alloyed thickness of 0.0003 inch. Deposition may be by electroplating or any other suitable deposition process. If electroplated, the coating is deposited such that the two metals are contiguous to each other. That is, the metals may be intermixed during the deposition, or otherwise deposited such that an alloy will form when the metals are liquified. For example, in electroplating lead-tin, anodes of pure lead and pure tin are provided in a plating bath consisting of but not limited to stannous fluoborate, lead fluoborate, fluobonic acid, boric acid, peptone and water. The plating temperature may be ambient, operating at a current density of 30 amperes per square foot with mild agitation.

The board of FIG. 1, after lead-tin plating, is conveyed in the direction of arrow 18 by conveyor means (not shown) in a conventional manner at a uniform predetermined rate, for example, at a constant rate within the range of 0.5 to 3 feet per minute.

The optimum conveying rate is sufficiently slow such that the coating will be completely melted while at the same time being sufficiently fast to prevent burning the board or otherwise degrading it due to overexposure to the heat transfer fluid, in a manner to be described.

A heat transfer fluid 20 is pumped through a nozzle 24 to form a standing wave 22 having a predetermined flow rate. For example, the fluid may be pumped at a pressure in the range of 5 to 10 p.s.i. through a rectangular nozzle having an aperture of approximately ½ inch by 12 inches. The apparatus forming the standing wave is similar to the apparatus utilized in the art to form standing waves of solder which are used to wave solder components to printed circuit boards. In FIG. 1, an end view of the wave is shown, the wave being elongated into the paper. The wave 22 is as long into the paper as the board 10 is wide into the paper such that the wave 22 will be in contact with board 10 along the entire underside surface 15 thereof as the board is conveyed in direction 18. The heat transfer fluid 20 is pumped through nozzle 24 in direction 19 to a predetermined height and then cascades over the nozzle as indicated. Means for heating, storing, and pumping the fluid are conventional. As mentioned herein, when a surface is said to face a wave, it is meant that the flow of the fluid in the wave is directed against that surface. For example, the flow direction 19 of wave 22 is against surface 15 of board 10 of FIG. 1, surface 15 being in a position where it is oriented to face wave 22.

The heat transfer fluid 20 is heated to a temperature sufficiently high to liquify the lead-tin coating 14. For example, with a eutectic lead-tin composition of 63% tin and 37% lead it has been found that a temperature of 460° F. to 490° F. will alloy the coating satisfactorily. A variety of heat transfer fluids are available for the process of the present invention and include paraffins, fats and mineral and vegetable oils. Preferably an animal fat, such as Hydrofol Tin Fat manufactured by Archer Daniels Midland Company of Chicago, processed to be heat resistant, is suitable. The heat transfer fluid in any case must be thermally stable at approximately 400–600° F., and for prevention of hazardous operation, have a fire and flash point sufficiently above the working temperature of the fluid. In this case, Hydrofol Tin Fat has a fire point of 630° F. and a flash point of 570° F. which are safely above the 490° F. maximum operating temperature of the preferred process.

Once having formed the stationary wave 22 of heat transfer fluid 20, board 10 is passed through the wave in such a manner that coating 14 is in thermal contact therewith and liquified. Cladding 27, however, has a sufficiently high melting point so that it does not melt when exposed to the heat transfer fluid. In FIG. 1*a*, board 10 is shown being conveyed in direction 18 toward wave 22. The board is spaced above the level 21 of fluid 20 in predetermined relation to the height 25 of wave 22 such that the fluid will flow against the underside 15 of the board. In FIG. 1*b*, the board 10 is shown at the position where it has entered the wave 22. Leading edge 16 of the board is immersed in the fluid such that the crest 27 of the wave preferably cascades over the leading edge onto the upper surface 11 of the board. The remainder of the wave flows against a portion of the underside 15 and cascades back to the reservoir 30. The board is preferably conveyed at a uniform rate throughout the process.

In FIG. 1*c*, the board 10 is shown in the state where leading edge 16 has passed through the wave. Meantime the fluid is flowing against the board in direction 19. At this stage, typical aperture 13, which also has a lead-tin coating deposited thereon, is directly over the wave. At this point, the fluid flows through aperture 13 to the upper side 11 at which side it preferably joins and adds to the flowing heat transfer fluid that cascaded over the leading edge. Fluid 20 on the upperside 11 flows along that side liquifying coating 14 therein. Upon passing the board 10 through wave 22, the coating 14 is thereafter cooled such that the liquified metals form a solid alloy. Cooling may be accomplished by any conventional process, such as exposure to the ambient or by quenching.

Of course, if the amount of fluid flowing on the upper side 11 is small compared to the area to be covered, then it is possible that the coating may not be fully melted. In this instance, the alloy may be improved by reversing the orientation of the sides 15 and 11. In the first pass, side 15 faces the wave. By passing the board through the wave a second time with side 11 oriented to face the wave, then optimum quality of alloy may be obtained on both sides. But, in any case, the coating in aperture 13 will be properly alloyed, even with only one pass through the wave. In some cases, when the surfaces including the metals to be alloyed are thermally coupled to relatively large heat sinks, for example, large conductive ground planes, then a second pass through the wave with the same surface oriented to face the wave in both passes may be desirable.

By adjusting the flow rate of the fluid, the passing rate of the surface to be alloyed, the temperature of the fluid and the spaced relation of the surface to the wave as indicated above, boards of thickness variations of 0.032 to 0.125 inch having single or multiple conductive layers were successfully alloyed. Further, none of the component apertures such as hole 13 which typically varies from 0.022 to 0.052 inch in diameter were filled with solder after the alloying process. In addition, the disclosed process reduces the deposited thickness by a controlled amount, generally about a 40% reduction. Thus, with a 0.0005 thick deposit, an approximate 0.0003 thick alloy may be maintained uniformly throughout the surfaces to be alloyed. None of the prior art processes are controllable to this extent.

In the process described above, the printed circuit board 10 was illustrated as having a typical aperture 13. Other printed circuit boards, however, having no apertures therethrough, may be equally well processed in accordance with the present invention. In this latter instance, the fluid 20 of wave 22 of FIG. 1 is flowed against the surfaces to be alloyed one surface at a time. For example, if aperture 13 were not present, then as shown by FIG. 1, surface 15 of board 10 would face wave 22. Then, if surface 11 were also coated and required to be alloyed, a second pass through wave 22 would be made, with surface 11 facing wave 22. In this case, the flow of fluid 20 along the side oppositely disposed the side facing the wave would not be necessary, and the spaced relation of the side to be alloyed with respect to wave 22 need only be such as to cause wave 22 to flow against that side.

The method described above produces a superior alloy on substantially all surfaces passed through a wave for the following reasons. First, a controlled, maximum concentration of heat transfer fluid is gently flowed against the surface to be alloyed. Thus the fluid provides total immersion and a very gentle wiping action imposing minimum direct force against the coating. This gentle wiping action prevents reflowing the alloy away from the surfaces to be coated therewith due to pressure forces exerted by the heat transfer fluid which might otherwise occur with other actions, for example, spraying or spinning. Secondly, the continuous flow of the wave provides total immersion of the coating to be alloyed while at the same time preventing momentary or prolonged hot spots of the fluid since the pumping action which forms the fluid into a wave ensures uniform heat distribution within the wave by the agitation provided thereby. Thirdly, the uniform rate of travel of the surface through the wave coupled with its substantially horizontal orientation, although other orientations of the surface are also within the scope of the present invention, prevent the flowing of the melted coating into puddles due to the uniform gravitational action on the melted coating.

This uniform gravitational action also prevents submarginal thicknesses from occurring by preventing excessive flow of the melted coating away from the area of original disposition. Excessive rates of immersion of the coated surfaces into the heat transfer fluid, in addition to providing insufficient time of immersion for melting the coating, may subject the coating to undesirable forces which cause poor distribution of the coating. On the other hand, it has been found that any portion of an immersed surface of a printed circuit board being conveyed at the rate of the present process mentioned above through the wave of heat transfer is exposed to the heat transfer fluid for about 5 seconds. Due to the continuous flowing nature of the wave, the fluid flowing or wiping against the surface to be alloyed is continually refurbished so that the temperature thereof is held uniformly constant. In other processes, this is difficult to achieve. In addition. as the fluid is recirculated, filters and other means may be provided for continuously cleansing the fluid of foreign particles which might otherwise cause detrimental imperfections in the alloy.

In FIG. 2 there is shown a cross sectional view of typical coating 14 on a conductive copper pattern 40 printed on a substrate 12 in accordance with the process of the present invention, in which FIG. 2*a* shows the overhanging coating 14 after a pattern on substrate 12 is etched out of the cladding. The overhanging portion 43 of the coating causes stringers which may cause short circuits on the printed circuit board. Area 47 of conductive pattern 40, after etching is exposed to the ambient, and therefore is subject to oxidation. In FIG. 2*b*, note that a uniform coating is formed over all of the copper pattern after alloying the coating according to the present invention. The thickness of this coating is uniform and consistent within each board and between boards.

In contradistinction to wave solder machines which are used to assemble components to completed printed circuit boards, the present process utilizes similar machines to manufacture printed circuit boards. The alloying process of the present invention produces a finish that is cosmetically pleasing, is capable of permitting board storage for long periods of time without serious oxidation, and is a superior alloy readily adapted to automatic soldering techniques. This alloying process is readily adapted to the manufacture of printed circuit boards regardless of whether the technique of manufacture is additive or subtractive. In addition, metals other than lead-tin may be alloyed in accordance with the process of the present invention.

I claim:

1. A method of alloying at least two metals, comprising the steps of:

depositing the metals contiguous to each other on a substrate, passing the substrate through a stationary wave of a hot oil heat transfer fluid heated to a predetermined temperature sufficiently high to liquify the deposited metals, said metals being in thermal contact with the heat transfer fluid for a time sufficiently long so that upon cooling said liquified metals form a solid alloy, said substrate forming a planar double-faced sheet, said sheet having a plurality of apertures therethrough, said metals being deposited on opposite first and second surfaces and within said apertures, said passing step further incluring the step of disposing said sheet in contact with said wave such that said heat transfer fluid flows through said apertures in thermal contact with both faces of said sheet for a time sufficient to liquify said deposited metals, whereby said deposited metals are maintained substantially in situ.

2. The method of claim 1 wherein said passing step further includes the step of positioning said sheet with respect to the wave such that a portion of said fluid flows against said first surface and onto said second surface at a leading edge thereof when the leading edge is inserted into said wave.

3. The method of claim 1 in which said passing step further includes orienting said first surface to face said wave.

4. The method of claim 3 further including the step of reversing the orientation of said sheet such that said second surface faces said standing wave when passed therethrough, and passing the sheet through the wave with the deposited metals in thermal contact with the heat transfer fluid for a time sufficient to liquify the metals deposited thereon.

5. A method for alloying at least two metals deposited in intermixed relation on a plurality of conductors formed on both sides of a printed circuit board, comprising:

forming a stationary wave of a hot oil heat transfer fluid heated to a temperature capable of liquifying the two metals, the fluid of said wave having a predetermined flow rate, passing said conductors through the wave at a predetermined rate with said conductors on one of said sides facing said wave, said deposited metals on said one side being in thermal contact with said fluid, the values of said flow rate and passing rate being selected to cause said fluid to liquify said deposited metals when in thermal contact therewith, and cooling said liquified metals to form a solid alloy, said printed circuit board having a plurality of through holes in which said two metals are deposited, said passing step including the step of causing said heat transfer fluid to flow through said holes to the side of said printed circuit board oppositely disposed said wave when the board is passed therethrough, and causing said fluid to flow along said opposite side in thermal contact therewith such that said opposite side deposited metals are liquified without degrading said printed circuit board, whereby said deposited metals are maintained substantially in situ.

6. A method of alloying a lead-tin coating deposited on conductors on both sides of a printed circuit board of a predetermined width, comprising:

forming a standing wave of a hot oil heat transfer fluid heated to a temperature sufficiently high to liquify the lead-tin coating when the fluid is flowed against the printed circuit board, said wave being at least as long as said printed circuit board is wide, the fluid of said wave having a predetermined flow rate, passing said printed circuit board through the wave such that a portion of the wave flows over the leading edge of said board, said board being passed at a predetermined rate with said conductors oriented to face said wave, said lead-tin coating being in thermal contact with said fluid, said flow rate, said passing rate, and said fluid temperature being related such as to cause said fluid to liquify said lead-tin coating without degrading said printed circuit board, and cooling sad liquified coating to form a solid alloy, whereby said deposited metals are maintained substantially in situ.

7. The method of claim 6 further including the step of passing said printed circuit board a second time through the wave with the deposited lead-tin coating in thermal contact with the heat transfer fluid for a time sufficient to melt the coating so that upon cooling a solid alloy is formed.

8. The method of claim 6 wherein said fluid temperature is sufficiently high to melt said deposited coating while heating heat sinks which pass through said wave in thermal contact with said printed circuit board, and, the passing rate being at a rate sufficiently slow to permit melting of said deposited coating while sufficiently fast to prevent burning the printed circuit board.

9. A method of manufacturing a printed circuit board in which a dielectric board is clad on at least one side thereof with an electrically conductive material, comprising:

depositing a lead-tin coating on said conductive material in accordance with a printed circuit pattern, removing a portion of said cladding in accordance with said printed circuit pattern by etching, and passing the dielectric board at a predetermined rate through a stationary wave of a hot oil heat transfer fluid heated to a predetermined temperature sufficiently high to liquify the lead-tin coating, said coating being in thermal contact with the heat transfer fluid for a time sufficient to be liquified so that upon cooling a solid lead-tin alloy is formed, said passing being sufficiently fast to prevent degrading the board.

10. The method of claim 9 further including passing said printed circuit board through the wave a second time with the lead-tin coating in thermal contact with the heat transfer fluid for a time sufficient to liquify the coating so that upon cooling, the liquified coating forms a solid lead-tin alloy.

11. The method of claim 9 wherein the cladding is copper.

12. The method of claim 9 wherein the cladding has a melting point sufficiently greater than the temperature of said heat transfer fluid such that only said deposited coating melts when in thermal contact with said heat transfer fluid.

13. The method of claim 9 wherein said heat transfer fluid is an animal fat.

14. The method of claim 9 wherein said lead-tin coating is deposited by simultaneous electro-plating of both metals in intermixed relation.

15. A method of manufacturing a printed circuit board, comprising:

depositing an electrically conductive material on at least one side of a dielectric board in accordance with a printed circuit pattern, depositing a lead-tin coating on said conductive material, and passing the dielectric board at a predetermined rate through a stationary wave of a hot oil heat transfer fluid heated to a predetermined temperature sufficiently high to liquify the lead-tin coating, said coating being in thermal contact with the heat transfer fluid for a time sufficient to be liquified so that upon cooling a solid lead-tin alloy is formed, said passing being sufficiently slow to melt the coating and sufficiently fast to prevent degrading the board, whereby said deposited metals are maintained substantially in situ.

References Cited

UNITED STATES PATENTS

| | | | |
|---|---|---|---|
| 699,592 | 5/1902 | Thompson | 29—502 |
| 2,671,264 | 3/1954 | Pessel | 29—503 X |
| 2,803,216 | 8/1957 | Termini et al. | 29—503 UX |
| 2,986,811 | 6/1961 | Rudd | 29—498 X |
| 2,993,272 | 7/1961 | Carlzen et al. | 29—503 |
| 3,214,827 | 11/1965 | Phohofsky | 29—503 X |
| 3,242,565 | 3/1966 | North et al. | 29—502 X |
| 3,350,498 | 10/1967 | Leeds | 29—624 X |
| 3,413,711 | 12/1968 | Brewer et al. | 29—503 X |
| 3,454,374 | 7/1969 | Domin | 29—502 X |
| 3,483,616 | 12/1969 | Shomphe | 29—502 X |
| 3,500,536 | 3/1970 | Goldschmied | 29—487 X |

JOHN F. CAMPBELL, Primary Examiner

R. J. SHORE, Assistant Examiner

U.S. Cl. X.R.

29—498, 625; 117—64, 217, 227; 228—37